(12) United States Patent
Beyne et al.

(10) Patent No.: US 10,066,303 B2
(45) Date of Patent: Sep. 4, 2018

(54) THIN NIB OR COB CAPPING LAYER FOR NON-NOBLE METALLIC BONDING LANDING PADS

(71) Applicants: IMEC VZW, Leuven (BE); GLOBALFOUNDRIES INC., Grand Cayman (CA)

(72) Inventors: Eric Beyne, Leuven (BE); Joeri De Vos, Neerwinden (BE); Jaber Derakhshandeh, Leuven (BE); Luke England, Saratoga Springs, NY (US); George Vakanas, Tempe, AZ (US)

(73) Assignees: IMEC VZW, Leuven (BE); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/634,535

(22) Filed: Feb. 27, 2015

(65) Prior Publication Data
US 2015/0247244 A1    Sep. 3, 2015

(30) Foreign Application Priority Data
Mar. 1, 2014   (EP) .................................... 14157400

(51) Int. Cl.
   *B32B 15/00* (2006.01)
   *C23C 30/00* (2006.01)
   *H01L 23/00* (2006.01)

(52) U.S. Cl.
   CPC .............. *C23C 30/00* (2013.01); *H01L 24/05* (2013.01); *H01L 24/03* (2013.01); *H01L 24/13* (2013.01); *H01L 24/45* (2013.01); *H01L 24/48* (2013.01); *H01L 24/81* (2013.01); *H01L 24/85* (2013.01); *H01L 2224/031* (2013.01); *H01L 2224/03464* (2013.01); *H01L 2224/0401* (2013.01); *H01L 2224/04042* (2013.01); *H01L 2224/04073* (2013.01); *H01L 2224/0518* (2013.01); *H01L 2224/05147* (2013.01);
   (Continued)

(58) Field of Classification Search
   None
   See application file for complete search history.

(56) References Cited

U.S. PATENT DOCUMENTS 3,045,334 A * 7/1962 Berzins ................... C23C 18/34
                                                          106/1.27
3,781,596 A * 12/1973 Galli ................. H01L 23/49524
                                                           174/254

(Continued)

FOREIGN PATENT DOCUMENTS

JP          61-207045        9/1986

OTHER PUBLICATIONS

Yokoshima et al. "Interconnection of Micropad Electrodes by Controlled "Extraneous" Deposition of Electroless NiB Film", *Electrochemical and Solid-State Letters*, 10 (9) D92-D94 (2007).

*Primary Examiner* — Seth Dumbris
(74) *Attorney, Agent, or Firm* — Knobbe Martens Olson & Bear, LLP

(57) ABSTRACT

The invention relates to a substrate having at least one main surface comprising at least one non-noble metallic bonding landing pad covered by a capping layer thereby shielding the non-noble metallic bonding landing pad from the environment. This capping layer comprises an alloy, the alloy being NiB or CoB and containing an atomic concentration percentage of boron in the range of 10% to 50%.

15 Claims, 3 Drawing Sheets

(52) U.S. Cl.
CPC ............... *H01L 2224/05149* (2013.01); *H01L 2224/05155* (2013.01); *H01L 2224/05157* (2013.01); *H01L 2224/05563* (2013.01); *H01L 2224/05655* (2013.01); *H01L 2224/05657* (2013.01); *H01L 2224/13101* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13144* (2013.01); *H01L 2224/45124* (2013.01); *H01L 2224/45144* (2013.01); *H01L 2224/45147* (2013.01); *H01L 2224/48655* (2013.01); *H01L 2224/48657* (2013.01); *H01L 2224/48755* (2013.01); *H01L 2224/48757* (2013.01); *H01L 2224/48855* (2013.01); *H01L 2224/48857* (2013.01); *H01L 2224/81203* (2013.01); *H01L 2224/81455* (2013.01); *H01L 2224/81457* (2013.01); *H01L 2224/85205* (2013.01); *H01L 2224/85207* (2013.01); *H01L 2224/85355* (2013.01); *H01L 2224/85375* (2013.01); *H01L 2224/85455* (2013.01); *H01L 2224/85457* (2013.01); *Y10T 428/1291* (2015.01); *Y10T 428/12826* (2015.01); *Y10T 428/12861* (2015.01); *Y10T 428/12882* (2015.01); *Y10T 428/12931* (2015.01); *Y10T 428/12944* (2015.01); *Y10T 428/24917* (2015.01)

(56) References Cited

U.S. PATENT DOCUMENTS

| | | | |
|---|---|---|---|
| 6,040,239 A | 3/2000 | Akram et al. | |
| 6,706,422 B2 * | 3/2004 | Inoue | C23C 18/34 174/126.4 |
| 7,078,796 B2 * | 7/2006 | Dunn | G01L 19/0069 257/690 |
| 8,039,379 B1 * | 10/2011 | Alers | H01L 21/76849 257/E21.174 |
| 8,269,347 B2 | 9/2012 | Nakatani | |
| 8,309,164 B2 | 11/2012 | Imai et al. | |
| 2001/0033020 A1 | 10/2001 | Stierman | |
| 2003/0107137 A1 | 6/2003 | Stierman | |
| 2003/0193094 A1 * | 10/2003 | Takahashi | H01L 24/11 257/780 |
| 2007/0075430 A1 * | 4/2007 | Suh | B23K 35/3006 257/762 |
| 2008/0119047 A1 * | 5/2008 | Yu | H01L 21/76849 438/687 |
| 2013/0014978 A1 * | 1/2013 | Uzoh | H05K 3/4007 174/257 |
| 2014/0035168 A1 | 2/2014 | Schelling et al. | |

* cited by examiner

THIN NIB OR COB CAPPING LAYER FOR NON-NOBLE METALLIC BONDING LANDING PADS

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP14157400.4 filed Mar. 1, 2014. The aforementioned application is incorporated by reference herein in its entirety, and is hereby expressly made a part of this specification.

FIELD OF THE INVENTION

A capping layer covering non-noble metallic bonding pads on a substrate is provided.

BACKGROUND OF THE INVENTION

As new technologies employing bonded structures are developed, the use of Thermo Compression Bonding (TCB) is becoming more prevalent. TCB can for example be used for wire bonding, Flip Chip bonding or die stacking. It needs protruding contacts, e.g. stud bumps created from Au or Cu wires or Cu pillars with Sn based solder tips. These protruding contacts can be located on either the substrate or on another component of the bonded structure. Opposite to the protruding contacts flat contacts, preferably of the same material as the protruding contacts, serve as bonding partners and are called bonding landing pads. This material can be non-noble metals.

The TCB process realizes a final bond between these two components of the bonded structure by applying a pressure force profile and a heat profile on the two components to be bonded. Typically an underfill material is present between the two components during the TCB process.

In general there is a storage time between the manufacturing of the components to be bonded in a bonded structure, prior to them being bonded. It should be further noted that the assembly process itself and the storage is not necessary a non-oxidizing environment. These factors ultimately may lead to the oxidation of the non-noble metallic bonding landing pads. It is a well-known fact that oxidation of the non-noble metallic bonding landing pad often causes solder joint formation issues during the bonding process. This is especially true when the underfill material does not have enough fluxing capability to remove the non-noble metal oxides during the bonding process.

Coating or capping the metallic bonding landing pad with a thick (>0.5 um) Electro Less Deposition (ELD) of NiP, NiB with low (up to 5% by weight) Boron content, Au, Pd or stacked combinations thereof, are used to prevent oxidation of the metallic bond landing pad. An example can be found in U.S. Pat. No. 7,078,796 B2. These solutions require noble metals like Au or Pd having excellent non oxidizing properties, but which are expensive. These noble metals have excellent anti-oxidation properties, but are rare materials and expensive.

SUMMARY OF THE INVENTION

It is an aim of the aspects and embodiments described herein to replace these materials by cheaper alternatives that are commonly available.

Accordingly, in a first aspect, a substrate is provided, comprising: at least one main surface comprising at least one non-noble metallic bonding landing pad at least partially covered by a capping layer, where the capping layer is configured to shield the at least one non-noble metallic bonding landing pad from an external environment, wherein the capping layer comprises an alloy, wherein the alloy is selected from the group consisting of NiB and CoB, and wherein the alloy has an atomic concentration percentage of boron of from 10% to 50%.

In an embodiment of the first aspect, a thickness of the capping layer is greater than 9 nm and smaller than 50 nm.

In an embodiment of the first aspect, the non-noble metallic bonding landing pad contains at least one metal selected from the group consisting of Cu, Co, Ni, Mo, Mn, and combinations thereof.

In an embodiment of the first aspect, the at least one non-noble metallic bonding landing pad is fully covered by the capping layer.

In a second aspect, a substrate is provided, comprising: at least one main surface comprising at least one non-noble metallic bonding landing pad partially covered by a capping layer, where the capping layer is configured to shield the at least one non-noble metallic bonding landing pad from an external environment, wherein the capping layer comprises an alloy, wherein the alloy is selected from the group consisting of NiB and CoB, and wherein the alloy has an atomic concentration percentage of boron of from 10% to 50%. In an embodiment of the first aspect, a thickness of the capping layer is greater than 9 nm and smaller than 50 nm.

In an embodiment of the second aspect, the non-noble metallic bonding landing pad contains at least one metal selected from the group consisting of Cu, Co, Ni, Mo, Mn, and combinations thereof.

In an embodiment of the second aspect, the non-noble metallic bonding landing pad at least partially extends above the main surface and the capping layer only covers a topside of the non-noble metallic bonding landing pad.

In an embodiment of the second aspect, the non-noble metallic bonding landing pad at least partially extends above the main surface and the capping layer only covers sidewalls of the non-noble metallic bonding landing pad that extend above the main surface.

In an embodiment of the second aspect, the substrate further comprises a material layer that at least partially covers a topside of the non-noble metallic bonding landing pad, the material layer comprising intermetallic compounds and interstitial boron, the intermetallic compounds comprising a combination of a metal of the non-noble metallic bonding landing pad, a main solder metal, and a metal selected from the group consisting of Ni and Co.

In an embodiment of the second aspect, the substrate further comprises a material layer that at least partially covers the part of the non-noble metallic bonding landing pad not covered by the capping layer, the material layer comprising intermetallic compounds and interstitial boron, the intermetallic compounds comprising a combination of a metal of the non-noble metallic bonding landing pad, a main solder metal, and a metal selected from the group consisting of Ni and Co.

In an embodiment of the second aspect, the main solder metal is selected from the group consisting of Sn, Zn, Bi, Pb, and In.

In a third aspect, a method is provided for manufacturing a substrate, comprising: providing a substrate comprising, on a main surface, at least one non-noble metallic bonding landing pad; cleaning the main surface of the substrate; and depositing a capping layer on the cleaned surface of the metallic bonding landing pad, whereby the non-noble metallic bonding landing pad is at least partially covered by the capping layer, wherein the capping layer comprises an alloy selected from the group consisting of NiB and CoB, wherein the alloy has an atomic concentration percentage of boron of from 10% to 50%, whereby the substrate of the first or second aspect is obtained.

DETAILED DESCRIPTION OF THE PREFERRED EMBODIMENT

Figure 1A:
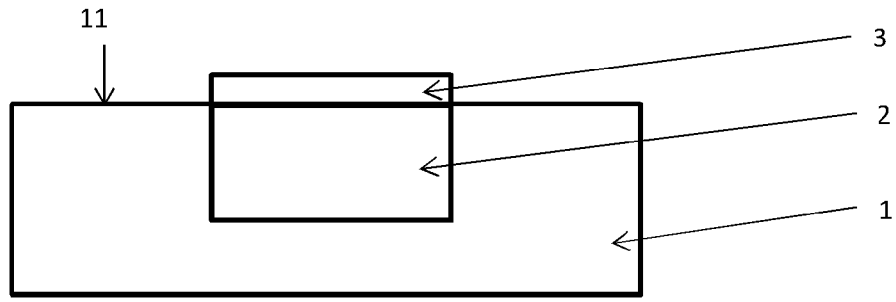
FIGS. 1A, 1B, 1C, and 1D shows possible implementations according to the first aspect where the capping layer fully covers the non-noble metallic bonding landing pad.

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The illustrative embodiments described in the detailed description, drawings, and claims are not meant to be limiting. The teachings herein can be applied in a multitude of different ways, including for example, as defined and covered by the claims. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspect and that two or more of these aspects may be combined in various ways. For example, a system or apparatus may be implemented or a method may be practiced by one of skill in the art using any reasonable number or combination of the aspects set forth herein. In addition, such a system or apparatus may be implemented or such a method may be practiced using other structure, functionality, or structure and functionality in addition to or other than one or more of the aspects set forth herein. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and made part of this disclosure. It is to be understood that the disclosed embodiments are not limited to the examples described below, as other embodiments may fall within disclosure and the claims.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

FIG. 1A illustrates, according to a first aspect, a substrate 1 having at least one main surface 11 comprising at least one non-noble metallic bonding landing pad 2 covered by a capping layer 3 shielding the non-noble metallic bonding landing pad 2 from the environment. This capping layer 3 comprises an alloy, the alloy being NiB or CoB and containing an atomic concentration percentage of boron in the range of 10% to 50%.

Figure 1B:
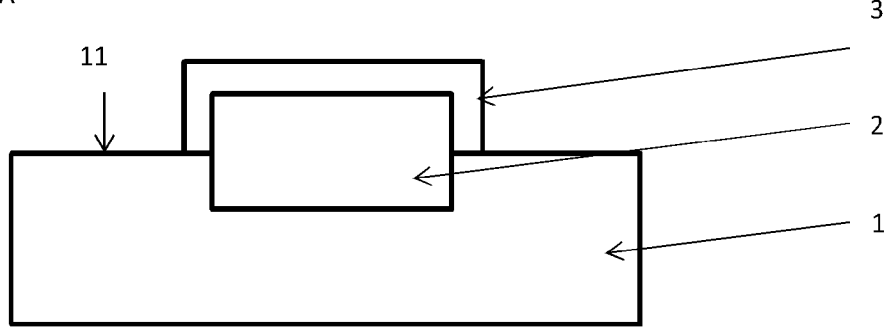
Figure 1C:
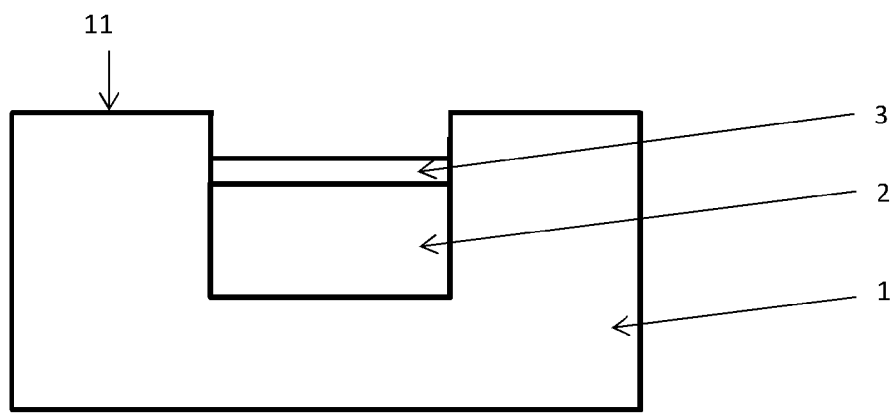
Figure 1D:
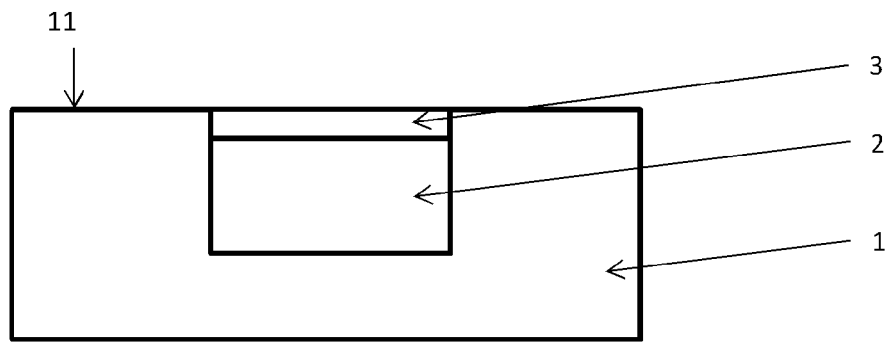

FIGS. 1B and 1C demonstrate other alternative implementations of the first aspect. It is readily understood that alternative implementations are possible.

The substrate 1 of FIGS. 1A, 1B, 1C, and 1D can be selected from the list of a semiconductor substrate, a printed circuit board, a glass panel, a flexible substrate, a reconstructed wafer or any substrate comprising a non-noble metallic bonding landing pad 2 on a main surface 11. The semiconductor substrate can comprise at least one semiconductor device and an interconnect structure, the at least one semiconductor device being electrically connected to the non-noble metallic bonding landing pad through at least part of the interconnect structure. The substrate 1 can comprise a stack of at least two bonded dies, a stack of at least one bonded die on an interposer substrate or a stack of at least one bonded die on a wafer.

The main surface 11 of the substrate 1 in FIGS. 1A, 1B, 1C, and 1D is a surface which is flat, as this is the surface where bonding is done, for instance 'flipchip thermo compression bonding on a silicon interposer substrate'. Note that this main surface can be the top or the bottom flat surface of the substrate 11 or both.

The non-noble metallic bonding landing pad 2 in FIGS. 1A, 1B, 1C, and 1D is configured as the receiving entity in a bonding process. Typically a certain stand-off height is required between the two entities or components to be bonded for various reasons well known in the art such as stress relief, underfill dispense F dispense or fluxing. The non-receiving entity in the bonding process typically has the bonding material whereas the receiving entity has a landing pad to accommodate the bonding material during the bonding process. The bonding material can be but is not limited to: solder, bondwire, metallic pillar, etc.

The non-noble metallic bonding landing pad 2 related to the first aspect, does exclude noble metals, like Au and Pd. These noble metals have excellent anti-oxidation properties, but are rare materials and expensive. It is an aim of the aspects and embodiments to replace these materials by cheaper alternatives that are commonly available.

As noble metallic bonding layers are excluded from the non-noble metallic bonding landing pad 2, a capping layer 3 is required to avoid oxidation of the non-noble metallic bonding landing pads 2. The capping layer 3 covers the non-noble metallic bonding landing pads 2 thereby shielding the non-noble metallic bonding landing pads 2 from the oxidizing environment. Note that the metallic bonding landing pad, where covered by the capping layer 3, is in direct contact with this capping layer 3.

The environment may contain oxygen that even in small amounts, e.g. as low as 30 ppm, will lead to oxidation of a non-noble metal. This oxidation can occur even in tools using a nitrogen ambient and/or fluid vapor-phase atmospheres during soldering, as the partial pressure of oxygen in such ambient might still significant and hence results in oxidation of a non-noble metallic bonding landing pad 2. The oxidation of the non-noble metallic bonding landing pad can take place during storage or in the bonding facility or assembly house of the substrate containing this metallic bonding landing pad. The capping layer 3 acts as a diffusion barrier layer preventing oxygen from the environment from traversing the capping layer 3 and reaching the non-noble metal of the non-noble metallic bonding landing pad 2. Vice versa, the capping layer 3 also prevents metal from the non-noble metallic bonding landing pad 2 to diffuse outwards traversing the capping layer 3 and reaching the environment where it will readily oxidize when oxygen is encountered.

It is well-known that oxidation of non-noble metallic bonding landing pads 2 leads to inferior bonds and must be avoided to maintain a high bonding yield, a good bonding reliability and a cost efficiency of the bonded structure.

It was surprisingly found in accordance that using a NiB or CoB alloy with an atomic concentration percentage of B from 10% to 50% as a capping layer 3 covering the non-noble metallic bonding landing pads 2 yielded excellent diffusion barrier properties effectively preventing diffusion through the capping layer and thus preventing oxidation of the non-noble metal of the non-noble metallic bonding landing pad 2 covered by the capping layer 3.

It was surprisingly found in accordance with the first aspect, that using a NiB or CoB alloy with an atomic concentration percentage of B from 10% to 50% as a capping layer 3 covering non-noble metallic bonding landing pads 2 yielded excellent wetting properties of the part of the non-noble bonding landing pad 2 covered by the capping layer, allowing good solderability with typically solders such as Sn.

It was surprisingly found in accordance with the first aspect, that using a NiB or CoB alloy with an atomic concentration percentage of B from 10% to 50% as a capping 3 layer covering a non-noble metallic bonding landing pad 2, this pad 2 did not readily oxidize when in contact with the normal environment being air, which contains oxygen. It is currently believed that this is might be due to the high atomic concentration percentage of B in the NiB or CoB alloy, the B acts as an interstitial element in the Ni or Co metal thereby preventing oxidation of the Ni or Co present in the capping layer 3. B is small enough, in physical size, to fit into the spaces in the Ni or Co Lattice. As such, the NiB or CoB behaves as a noble metal but at a lower cost. Lower atomic concentration percentages of B have been found not sufficient to prevent oxidation of the NiB or CoB itself. This is believed to be related to vacancies in the Ni or Co lattices, that would still be present thereby allowing the oxygen from the ambient to oxidize the Ni or Co.

It was surprisingly found in accordance with the first aspect, that using a NiB or CoB alloy with an atomic concentration percentage of B from 10% to 50% as a capping 3 layer covering a non-noble metallic bonding landing pad 2, this pad did not readily corroded when in contact with the normal environment, which contains $H_2O$. It is currently believed that this is might be due to the high atomic concentration percentage of B in the NiB or CoB alloy, the B acts as an interstitial element in the Ni or Co metal thereby preventing corrosion of the Ni or Co in the capping layer 3. B is small enough, in physical size, to fit into the spaces in the Ni or Co lattice. As such, the NiB or CoB effectively behaves as a noble metal but at a lower cost. Lower atomic concentration percentages of B have been found not sufficient to prevent corrosion of the NiB or CoB itself. This is believed to be related to vacancies in the Ni or Co lattices, that would still be present thereby allowing the $H_2O$ to corrode the Ni or Co.

It was surprisingly found in accordance with the first aspect, that using an NiB or CoB alloy with an atomic concentration percentage of B from 10% to 50% as a capping layer 3 covering a none-noble metallic bonding landing pad 2 a hard and smooth outer surface of the capping layer was obtained which prevents the capping layer 3 from being damaged during, for instance, probe tests. Substrates 1 according to the embodiments are generally tested by probe needles which are being pressed against the bonding landing pad to establish an electrical contact during production testing to check if the substrates 1 are functional prior to bonding or during the assembly process. This prior testing avoids that erroneous substrates are being populated with expensive bonding entities. So probe test is needed to control costs. A further advantage of the increased hardness of capping layer 3, compared to the hardness of noble metals or not capped non-noble metallic bonding landing pads, is that the pressure in the bonding process can be reduced when using compression type bonding. This improves manufacturability of the bonds, as less pressure means less risk of damaged devices located in the vicinity of the none-noble metallic bonding landing pad 2, and as such being subjected to the local pressure applied during the bonding process. The hardness of the capping layer generally increases with increasing B atomic concentration. The minimum thickness guarantees a uniform capping layer with uniform properties including hardness.

An advantage of a capping layer of the first aspect is that a single capping layer 3 combines required functions such as diffusion barrier properties, constituting a non-oxidizing capping layer, increased hardness, being readily available, being cheap and having good wetting properties. This gives a cost advantage as well as a performance advantage due to these non-oxidizing properties.

The upper limit of the B atomic concentration percentage in accordance with the first aspect, is 50%. This corresponds to $Ni_1B_1$ or $Co_1B_1$. So in the upper limit, the complete capping layer 3 consists of $Ni_1B_1$ or $Co_1B_1$. At lower concentrations other borides are formed, for instance $Ni_3B$ this corresponds to a B atomic concentration percentage of 25%. The final composition of the capping layer 3 is a mix of metallic Ni and Ni borides or a mix of metallic Co with Co borides depending on material used for the capping layer.

In an embodiment the thickness of the capping layer 3 is greater than 9 nm and smaller than 50 nm. Reducing the thickness of the capping layer 3 covering a non-noble metallic bonding landing pad 2 enables further down scaling of, for instance but not limited to, μbumps used in thermo compression bonding during flipchip assembly. It should be noted that the disclosed thickness range of the capping layer 3 is much less than what is normally applied for instance for Au or Pd capping layers. This gives a clear advantage for current and future scaling. A thinner capping layer 3 also allow for a shorter deposition time and a higher throughput during manufacturing. It was found that a capping layer 3 thickness greater than 9 nm is required to have a uniform thickness of the capping layer 3 covering the non-noble metallic bonding landing pad 2. The upper limit is put to limit the amount of capping layer 3 material in the final bond. For wire bonding, a thick capping layer 3 is not required. Thicker layers will take more time to deposit. Most preferably the thickness of the capping layer for thermo compression bonding is in the range of 15 nm to 25 nm. Most preferably the thickness of the capping layer 3 for wire bonding is in the range of 9 nm to 15 nm.

In an embodiment, the non-noble metallic bonding landing pad 2 contains Cu, Co, Ni, Mo or Mn. These metals are non-noble and have the advantage of being known in the substrate manufacturing industry and are therefore compatible with the state-of-the-art infrastructure. In addition they allow for good electrical and thermal conduction so that the final bonding yields good electrical and thermal connections between the bonding entities. They also offer a good adhesion to the capping layer 3.

Figure 2A:
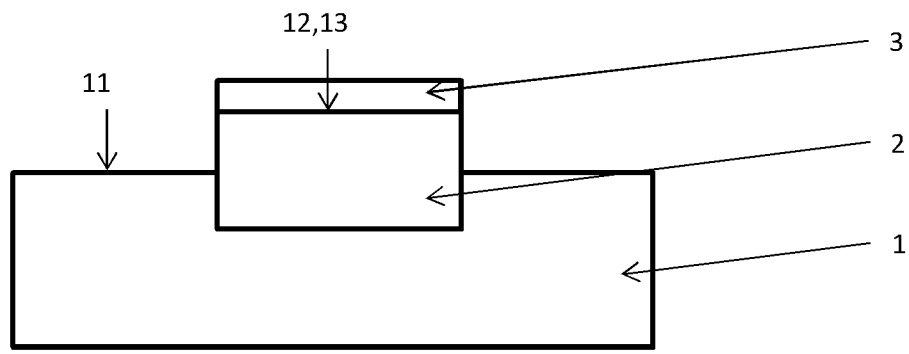
FIGS. 2A, 2B, and 2C show possible implementations according to the second aspect where the capping layer partially covers the non-noble metallic bonding landing pad.

A second aspect, illustrated in FIG. 2A, relates to a substrate 1 having at least one main surface 11 comprising at least one non-noble metallic bonding landing pad 2 partially covered by a capping layer shielding the covered part 12 of the non-noble metallic bonding landing pad 2 from the environment. This capping layer 3 comprises an alloy, the alloy being NiB or CoB and containing an atomic percentage of boron in the range of 10% to 50%.

Figure 2B:
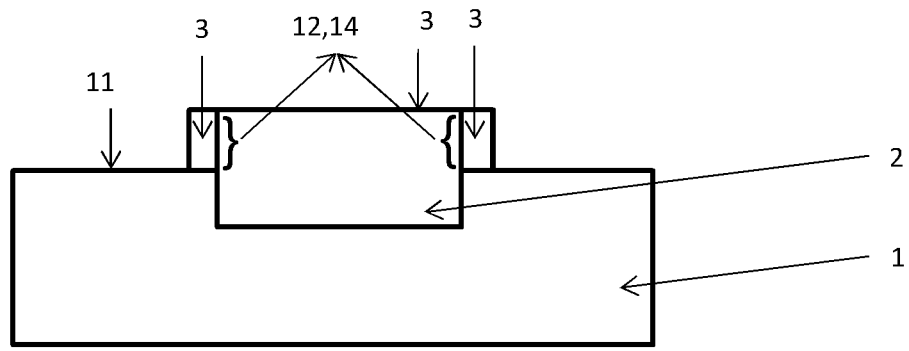

FIGS. 2A and 2B demonstrate alternatives implementations for the second. It is readily understood that other alternative implementations are possible.

Figure 2C:
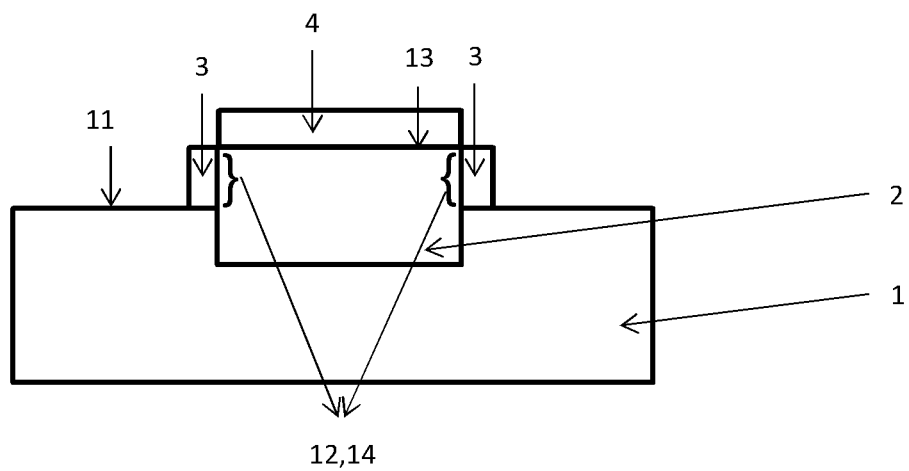

The substrate 1 of FIGS. 2A, 2B, and 2C can be selected from the list: a semiconductor substrate, a printed circuit board, a glass panel, a flexible substrate, or any substrate comprising a non-noble metallic bonding landing pad 2 on its main surfaces 11. The semiconductor substrate can comprise at least one semiconductor device and an interconnect structure, the at least one semiconductor device being electrically connected to the non-noble metallic bonding landing pad through at least part the interconnect structure. The substrate 1 can comprise a stack of at least two bonded dies or; a stack of at least one bonded die on an interposer substrate or; a stack of at least one bonded die on a wafer.

The main surface 11 of the substrate 1 in FIGS. 2A and 2B is one having a flat surface. This is the surface where bonding is done, for instance 'flipchip thermo compression bonding is done on a silicon interposer substrate'. Note that this main surface can be the top or the bottom flat surface of the substrate 11 or both.

The non-noble metallic bonding landing pad 2 in FIGS. 2A, 2B, and 2C is configured as the receiving entity in a bonding process. Typically a certain stand-off height is required between the two entities to be bonded for various reasons well known in the art such as stress relief, underfull dispense or, fluxing. The non-receiving entity in the bonding process typically has the bonding material whereas the receiving entity has a landing pad to accommodate the bonding material during the bonding process. The bonding material can be but is not limited to solder, bondwire, metallic pillar, etc.

The non-noble metallic bonding landing pad 2 does exclude noble metals, like Au and Pd. These noble metals have excellent anti-oxidation properties but are rare materials which are expensive. It is an aim of the aspects and embodiments to replace them by cheaper alternatives that are commonly available.

As noble metallic bonding layers are excluded from the non-noble metallic bonding landing pad 2, a capping layer 3 is required to avoid oxidation of the non-noble metallic bonding landing pads 2. The capping layer 3 partially covers the none-noble metallic bonding landing pad 2 thereby shielding the non-noble metallic bonding landing pad 2 from the environment at the location on the pad were the bonding will take place. Note that the metallic bonding landing pad, where covered by the capping layer 3, is in direct contact with this capping layer 3. The region of the non-noble metallic bonding pad 2 not covered by the capping layer 3 is not shielded from the environment and is hence exposed to the environment.

The environment containing oxygen can, even in small amounts down to 30 ppm, lead to oxidation of a non-noble metal. This oxidation can occur even in tools using a nitrogen ambient and/or fluid vapor-phase atmospheres during soldering, as the partial pressure of oxygen in these ambient is still significant resulting in oxidation of non-noble metallic bonding landing pad 2. This oxidation can take place during storage or in the bonding facility or assembly house. The capping layer 3 acts as a diffusion barrier layer preventing oxygen from the environment from traversing the capping layer 3 and reaching the non-noble metal of the non-noble metallic bonding landing pad 2 Vice versa the capping layer 3 also prevents the metal from the non-noble metallic bonding landing pad 2 to diffuse outwards traversing the capping layer 3 and reaching the environment where it will readily oxidize when oxygen is encountered.

It is a well-known fact that oxidation of non-noble metallic bonding landing pads 2 leads to inferior bonds and must hence be avoided to maintain a high bonding yield, a good bonding reliability and a cost efficiency of the bonded structure.

It was surprisingly found that using a NiB or CoB alloy with an atomic concentration percentage of B from 10% to 50% as a capping layer 3 partially covering the non-noble metallic bonding landing pads 2 yielded excellent diffusion barrier properties effectively preventing diffusion through the capping layer and thus preventing oxidation of the non-noble metal of the non-noble metallic bonding landing pad 2 covered by the capping layer 3.

It was surprisingly found that using a NiB or CoB alloy with an atomic concentration percentage of B from 10% to 50% as a capping layer 3 partially covering non-noble metallic bonding landing pads 2 yielded excellent wetting properties of the part of the non-noble bonding landing pad 2 covered by the capping layer, allowing good solderability with known solders such as Sn.

It was surprisingly found that using a NiB or CoB alloy with an atomic concentration percentage of B from 10% to 50% as a capping 3 layer partially covering a non-noble metallic bonding landing pad 2, this pad 2 did not readily oxidize when in contact with the normal environment being air, which contains oxygen. It is currently believed that this is might be due to the high atomic concentration percentage of B in the NiB or CoB alloy, the B acting as an interstitial element in the Ni or Co metal prevents oxidation of the Ni or Co in the capping layer 3. B is small enough, in physical size, to fit into the spaces in the Ni or Co Lattice. As such, the NiB or CoB effectively behaves as a noble metal but at a lower cost. Lower atomic concentration percentages of B have been found not sufficient to prevent oxidation of the NiB or CoB itself. This is believed to be related to vacancies in the Ni or Co lattices that would still be present, allowing the oxygen to oxidize the Ni or Co.

It was surprisingly found that using a NiB or CoB alloy with an atomic concentration percentage of B from 10% to 50% as a capping 3 layer partially covering a non-noble metallic bonding landing pad 2, this pad 2 did not readily corroded when in contact with the normal environment, which contains H2O. It is currently believed that due to the high atomic concentration percentage of B in the NiB or CoB alloy, the B acts as an interstitial element in the Ni or Co metal preventing corrosion of the Ni or Co in the capping layer 3. B is small enough, in physical size, to fit into the spaces in the Ni or Co Lattice. As such the NiB or CoB effectively behaves as a noble metal but at a lower cost. Lower atomic concentration percentages of B have been found not sufficient to prevent corrosion of the NiB or CoB itself. This is believed to be related to vacancies in the Ni or Co lattices that would still be present, allowing the H2O to corrode the Ni or Co.

It was surprisingly found that using a NiB or CoB alloy with an atomic concentration percentage of B from 10% to 50% as a capping layer 3 partially covering a non-noble metallic bonding landing pad 2 provide a hard and smooth surface of the capping layer. This prevents the capping layer 3 from being damaged during for instance probe test. Substrates 1 are generally tested by probe needles which are being pressed against the bonding landing pad thereby establishing an electrical contact during production testing to check if the substrates 1 are functional prior to bonding or during the assembly process. This prior testing avoids that erroneous substrates are being populated with expensive bonding entities. So probe test is needed to control costs. A further advantage of the increased hardness of capping layer 3, compared to the hardness of noble metals or not capped non-noble metallic bonding landing pads, is that the pressure in the bonding process can be reduced when using compression type bonding. This improves manufacturability of the bonds, as less pressure means less risk of damaged devices located in the vicinity of the none-noble metallic bonding landing pad 2, and as such subjected to the local pressure applied during the bonding process. The hardness of the capping layer generally increases with increasing B atomic concentration. The minimum thickness guarantees a uniform capping layer with uniform properties including hardness.

An advantage of a capping layer of the second aspect is that a single capping layer 3 combines required functions such as a diffusion barrier properties, constituting a non-oxidizing capping layer, increased hardness, being readily available, cheap and having good wetting properties. This gives a cost advantage as well as a performance advantage due to non-oxidizing properties.

The upper limit of the B atomic concentration percentage in accordance with the second aspect, is 50%. This corresponds to $Ni_1B_1$ or $Co_1B_1$. So in the upper limit the complete capping layer 3 consists of $Ni_1B_1$ or $Co_1B_1$. At lower concentrations other borides are formed, for instance $Ni_3B$ which corresponds to a B atomic concentration percentage of 25%. The final composition of the capping layer 3 is a mix of metallic Ni and Ni borides or a mix of metallic Co with Co borides depending on the capping layer used.

In an embodiment the thickness of the capping layer 3 is greater than 9 nm and smaller than 50 nm. Reducing the thickness of the capping layer 3 partially covering non-noble metallic bonding landing pads 2 enables further downscaling of, for instance but not limited to, μbumps used in thermo compression bonding during flipchip assembly. It should be noted that the thickness of the capping layer 3 is much less than what is normally applied for instance for Au or Pd capping layers. This gives a clear advantage for current and future scaling. A thinner capping layer 3 also allows for shorter deposition time and a higher throughput during manufacturing. It was found that a capping layer 3 thickness greater than 9 nm is required to obtain a uniform thickness of the capping layer 3 covering the non-noble metallic bonding landing pad 2. The upper limit is put to limit the amount of capping layer 3 material in the final bond. For wire bonding a thick capping layer 3 is not required. Thicker layers will take more time to deposit. Most preferably, the thickness of the capping layer for thermo compression bonding is in the range of 15 nm to 25 nm. Most preferably, the thickness of the capping layer 3 for wire bonding is in the range of 9 nm to 15 nm.

In an embodiment the non-noble metallic bonding landing pad 2 contains Cu, Co, Ni, Mo or Mn. These metals are non-noble and have the advantage of being known in the substrate manufacturing industry. Hence they are compatible with the state-of-the-art infrastructure. In addition they allow for a good electrical and thermal conduction so that the final bonding yield good electrical and thermal connections between the bonding entities. They also offer a good adhesion to the capping layer 3.

In an embodiment, the non-noble metallic bonding landing pad 2 at least partially extends above the main surface 11 and the capping layer 3 only covers the topside 13 of the non-noble metallic bonding landing pad 2. This is a particular case where a raised non-noble metallic bonding landing pad 2 is provided extending above the main surface. This can be useful to create a stand-off height between the two bonding entities. The capping layer 3 on the topside 13 of the non-noble metallic bonding landing pad 2 provides a landing pad to the bonding by for instance wire bonding. Covering the complete topside 13 of the non-noble metallic bonding landing pad 2 allows for maximum bonding area and can be used to decrease the pitch between adjacent non-noble metallic bonding landing pads 2 thereby allowing for further scaling. Using the complete topside 13 of the non-noble metallic bonding landing pad 2 allows for a larger misalignment error between the two bonding entities.

In an embodiment the non-noble metallic bonding landing pad 2 at least partially extends above the main surface 11 and the capping layer 3 only covers the sidewalls 14 of the non-noble metallic bonding landing pad 2. This is a particular case where the topside 13 of the non-noble metallic bonding landing pad 2 is not covered by the capping layer 3. This is the case for instance after thermo compression bonding was performed. The thermo compression bonding causes the capping layer 3 on the topside 13 of the non-noble metallic bonding landing pad 2 to be dissolved in the solder, but leaves the sidewalls 14 of the non-noble metallic bonding landing pad 2 intact. An advantage is that the sidewalls 14 remain shielded from the environment after bonding, whilst the topside 13 allows good wettability to the solder and thus good solderability.

In an embodiment the non-noble metallic bonding landing pad 2 at least partially extends above the main surface 11 and the capping layer 3 only covers the sidewalls 14 of the non-noble metallic bonding landing pad 2. The pad 2 further contains a material layer 4 that at least partially covers the topside 13 of the non-noble metallic bonding landing pad 2, the material layer 4 comprises intermetallic compounds and interstitial B. These intermetallic compounds comprise a combination of a metal of the non-noble metallic bonding landing pad 2 and a main solder metal and Ni or Co. This is a particular case where the topside 13 of the non-noble metallic bonding landing pad 2 is not covered by the capping layer 3. This is the case for instance after thermo compression bonding was performed, the thermo compression bonding causing the capping layer 3 on the topside 13 of the non-noble metallic bonding landing pad 2 to dissolve in the solder, but leaving the side walls intact. The thermocompression bonding further leaves a material layer 4 on the topside 13 of the non-noble metallic bonding landing pad 2. The material layer comprises interstitial B, as B atoms are small enough to fit between the crystalline lattice locations of the different components of the material layer 4. The material layer also comprises intermetallic compounds formed due to the bonding process, the intermetallic compounds refers to solid-state phases involving metals. In intermetallic compounds, different elements are ordered into different sites in the structure, with distinct local environments. The intermetallic compounds comprised in the material layer are a combination of a metal of the non-noble metallic bonding landing pad 2 and a main solder metal and Ni or Co. So all three components can be detected including the Ni or Co used in the capping layer 3. An advantage is that the sidewalls remain shielded from the environment after bonding, whilst the topside 13 has a material layer that forms a good electrical and physical bond between the solder and the non-noble metallic bonding landing pad 2.

In an embodiment a substrate according to foregoing embodiments further comprises a material layer 4 that at least partially covers the part of the non-noble metallic bonding landing pad 2 not covered by the capping layer 3, whereby the material layer 4 comprises intermetallic compounds and interstitial B. The intermetallic compounds comprises a combination of a metal of the non-noble metallic bonding landing pad 2 and a main solder metal and Ni or Co. This allows the material layer, which is formed during the bonding process to be present at the regions of the non-noble metallic bonding landing pad 2 that are not covered by the capping layer 3. It is not required that the regions of the non-noble metallic bonding landing pad 2 that are not covered by the capping layer 3 are fully covered by the material layer 4. A partial coverage is sufficient, as the case where misalignment occurred between the two bonding entities and the top surfaces was not fully covered by the material layer. This does not exclude that a good bond can been made.

In an embodiment, the main solder metal is selected from the group: Sn, Zn, Bi, Pb or In. This main solder metal is the metal that is most present in a solder as most solders are composed of different materials including metals. The metal that is most common in the solder is the main solder metal. These solders show good wettability on the capping layer as disclosed in the second aspect.

In a third aspect, a method is provided to manufacture substrate according to the first or the second aspect, whereby a capping layer (3) at least partially covering a non-noble metallic bonding landing pad (2) at the main surface (11) of the substrate (1) is formed, the method comprising the following steps: providing a substrate comprising on a main surface thereof at least one non-noble metallic bonding landing pad (2); cleaning the main surface (11) of the substrate (1); and depositing a capping layer on the cleaned surface of the metallic bonding landing pad.

The capping layer can be deposited using Electro Less Deposition (ELD). The step of cleaning can be performed with an organic acid based cleaner and a De-Ionized (DI) water rinse. The ELD plating can be performed on LAM ELD2300 single wafer tool, with a typical plating rate of about 1 Angstrom per second. Optional the substrate can be rinsed with DI wager and dried by air.

The substrate 1 disclosed in the first and second aspect, is rigid and comprises: one or more layers of wiring, interconnecting at least one non-noble metallic bonding landing pad 2 to devices comprised within the substrate. These devices can comprise active devices (e.g. transistors, diodes), passive devices or components (resistors, capacitors, inductors), MEMS devices (e.g. Pressure sensors, accelerometers, gyroscopes). The substrate 1 further comprises at least non-noble metallic pad configured to contact external components. These non-noble metallic pads may be present on all surfaces of the substrate 1 (top, bottom and side surfaces). The substrate 1 may also contain wiring between different non-noble metallic pads, the wiring being located on the outer surface 11 of the substrate 1 e.g. when no components are internal to the substrate such as for PCB interconnect substrate. The substrate 1 can comprise a surface metallization pattern and a non-noble metallic pad that is subject to oxidation or corrosion if left unprotected. Typical materials of such a surface metallization pattern are Cu, Ni and Co. This surface metallization may be at a level higher than the substrate 1 main surface 11, e.g. bumps, add-on interconnect, at the same level, e.g. a planarized surface 11 by e.g. CMP, fly-cut, . . . , or at a lower surface than the surface 11 e.g. inside a cavity present in the substrate.

The at least one non-noble metallic bonding landing pad of this metallic surface can be connected to at least one electronic component or electronic subsystem. These connections are realized by soldering, thermo-compression, ultrasonic welding or bonding.

In a third aspect, a substrate 1 having at least one main surface 11 comprising at least one non-noble metallic bonding landing pad 2 covered by a material layer 4 is disclosed. The material layer 4 comprises intermetallic compounds and interstitial B, the intermetallic compounds comprising a combination of a metal of the metallic bonding landing pad and a main solder metal and Ni or Co.

The substrate 1 comprises interconnection wiring between at least one non-noble metallic contact to devices present within the substrate 1. These devices can be: active devices (e.g. transistors, diodes) passive components (resistors, capacitors, inductors), MEMS devices (e.g. Pressure sensors, accelerometers, gyroscopes). The substrate 1 may also comprise only wiring between the different none-noble metallic contact points on its main surface 11, as is the case on a printed circuit board. The substrate 1 comprises a surface metallization on at least one main surface 11 and at least one none-noble metallic contact pad that is subject to oxidation or corrosion if left unprotected. Typical materials of such surface metallization are Cu, Ni and Co. This metallization may be at a level higher than the substrate surface 11 (bumps, add-on interconnect), at the same level (planarized surface by e.g. CMP, fly-cut) or at a lower surface than the main surface 11 of the substrate 1 (e.g. inside a cavity present in the substrate). The at least one none-noble metallic contact pad related this metallic surface is to be connected to non-noble metallic contacts of other electronic components or electronic subsystems. These connections are realized by soldering, thermo-compression, ultrasonic welding or bonding.

The aspect is related to the use of a 10 to 50 nm thick electroless deposited NiB or CoB capping layer 3 with an atomic B concentration of 10 to 50%, deposited selectively on the exposed surface metallization prone to oxidation and corrosion, thereby preventing oxidation and/or corrosion of this surface metallization. This protection is achieved without the subsequent deposition of additional protection, such as the traditionally used noble metals Pd and Au. This thin layer capping layer 3 has following functionality: passivation, soldering, thermocompression, ultrasonic bonding, and thermo-sonic bonding. Passivation avoids the oxidation and corrosion of all exposed metal surfaces (traces, pads). Soldering allows for the successful soldering attachment of components due to the good wettability of solder to the NiB or CoB surfaces of the capping layer 3. During soldering, this capping layer 3 will be dissolved in the solder or be transformed intermetallic compounds. This allows for the interaction and formation of intermetallic compounds between the solder and the underlying non-oxidized metal. Soldering is the connection of two metallic bodies through the formation of intermetallic compounds between both materials, one of the materials (the solder) is heated close to or above its melting point to obtain a fast interdiffusion and alloying of the solder and the second body surface material. Thermocompression bonding uses mechanical pressure to connect two metallic bodies without melting. Through the use of heat and pressure, interdiffusion of material at the interface is promoted to obtain a solid connection between both bodies also known as the bonding entities. To be successful, clean, non-oxidized surfaces are required. In ultrasonic bonding, ultrasonic energy is applied during bonding thereby creating an intimate contact between the surface first metallic element (e.g. a bonding wire (Al, Au, Cu) or metallic bumps (Au)) and the surface of a second element also known as the non-noble metallic bonding landing pad 2 (=the bond pad, an exposed metallic surface). To be successful, clean, non-oxidized metal surfaces are required. In thermo-sonic bonding, a combination of thermocompression and ultrasonic bonding is used. The addition of ultrasonic energy during thermocompression is used to enhance the intermixing at atomic level at the surface of the two joining materials. In electronics, this method is mainly used for gold or copper wire bonding. In all these applications, the use of the thin NiB or CoB capping layer 3 allows us to create: non-oxidized surfaces that do not require coating with noble metals for assembly processes such as: soldering (Flip chip bonding, solder ball attach, surface mount assembly); thermo-compression (flip-chip) or Wire bonding (Ultrasonic or thermosonic Al, Au or Cu wire); oxidation and corrosion prevention of metal surfaces exposed on the device surface that does not require additional coating with protective layers. (E.g. parts of the metallic surfaces not covered solder during the soldering process or not covered by the bonded material (bump or wire) during the thermo-compression or wire bonding processes. The relevant surface metallization to be protected by NiB or CoB capping layer 3 are: Cu, Ni, Co or Mo.

Figure 3:
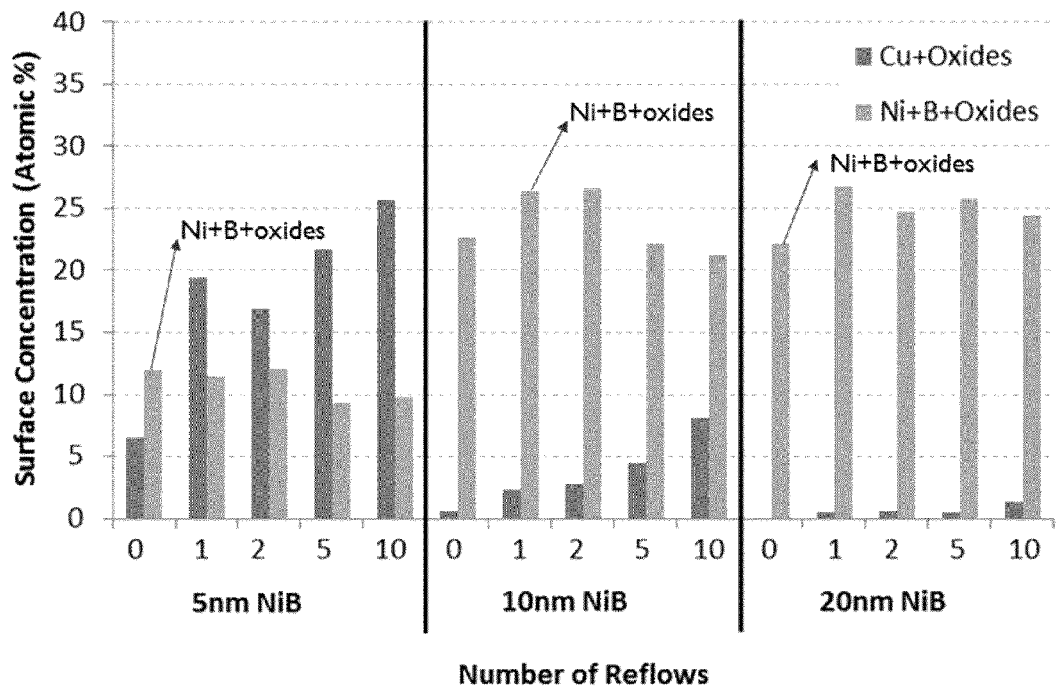
FIG. 3 shows the surface concentration (Atomic percentage: At %) of Cu-oxides and NiB oxides for different thickness of a NiB capping layer according to embodiments.

FIG. 3 illustrates an exemplary embodiment. Test samples were prepared with a, respectively 5 nm, 10 nm and 20 nm thick, NiB capping layer 3 containing 30 atomic % B, covering a Cu bonding landing pad 2. These test samples were then subjected to a number of thermal cycles ranging from 0 (no reflow) to 10 in an oxygen-containing ambient. During the reflow the temperature was as high as 300° C. Afterwards the presence of oxides was investigated using XPS. FIG. 3 shows the concentration of Cu, Ni and B and their oxides for blanket NiB coupons. The NiB layer of 10 or 20 nm thick was remarkably free of oxidation even after 10 reflows. The 5 nm NiB layer could not prevent oxidation of the underlying Cu, in particular, when subjected to a number of reflows.

Figure 4:
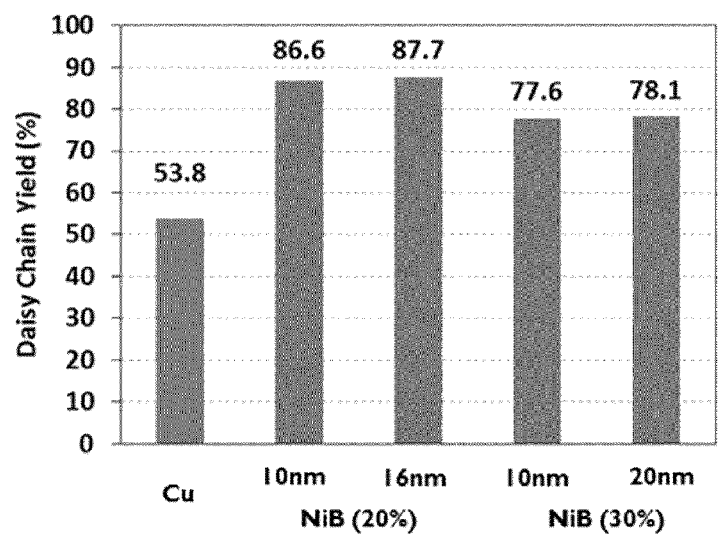
FIG. 4 shows the yield of a contact daisy chain for different thickness of a NiB capping layer according to embodiments of this disclosure.

FIG. 4 illustrates an exemplary embodiment. Test interpose samples containing a Cu contact daisy chain were prepared with respectively a 10 nm and 16 nm thick NiB capping layer 3 containing 20 atomic % B, a 10 nm and 20 nm thick, NiB capping layer 3 containing 30 atomic % B or no capping layer. FIG. 4 shows the yield of the different daisy chains. Having a NiB capping layer improved the yield. The thickness of the NiB capping layer had less impact on the yield than the B concentration.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A substrate, comprising:
   at least one main surface comprising at least one non-noble metallic bonding landing pad fully covered by a capping layer, wherein the non-noble metallic bonding landing pad contains at least one metal selected from the group consisting of Cu, Co, Ni, Mo, Mn, and combinations thereof, wherein the at least one non-noble metallic bonding landing pad is in direct contact with the capping layer, wherein a thickness of the capping layer is greater than 9 nm and smaller than 50nm, wherein the capping layer is configured to shield the at least one non-noble metallic bonding landing pad from an external environment, wherein the capping layer is an alloy, wherein the alloy is selected from the group consisting of NiB and CoB, and wherein the alloy has an atomic concentration percentage of boron of from 25% to 50%.

2. The substrate of claim 1, wherein the capping layer is deposited using electroless deposition.

3. A substrate, comprising:
   at least one main surface comprising at least one non-noble metallic bonding landing pad partially covered by a capping layer, wherein the at least one non-noble metallic bonding landing pad is in direct contact with the capping layer, wherein a thickness of the capping layer is greater than 9 nm and smaller than 50 nm, wherein the capping layer is configured to shield the at least one non-noble metallic bonding landing pad from an external environment, wherein the capping layer is an alloy, wherein the alloy is selected from the group consisting of NiB and CoB, and wherein the alloy has an atomic concentration percentage of boron of from 10% to 50%; and
   a material layer that at least partially covers the part of the non-noble metallic bonding landing pad not covered by the capping layer, the material layer comprising intermetallic compounds and interstitial boron, the intermetallic compounds comprising a combination of a metal of the non-noble metallic bonding landing pad, a main solder metal, and a metal selected from the group consisting of Ni and Co.

4. The substrate of claim 3, wherein the non-noble metallic bonding landing pad contains at least one metal selected from the group consisting of Cu, Co, Ni, Mo, Mn, and combinations thereof.

5. The substrate of claim 3, wherein the non-noble metallic bonding landing pad at least partially extends above the main surface and the capping layer only covers a topside of the non-noble metallic bonding landing pad.

6. The substrate of claim 3, wherein the non-noble metallic bonding landing pad at least partially extends above the main surface and the capping layer only covers sidewalls of the non-noble metallic bonding landing pad that extend above the main surface.

7. The substrate of claim 6, further comprising a material layer that at least partially covers a topside of the non-noble metallic bonding landing pad, the material layer comprising intermetallic compounds and interstitial boron, the intermetallic compounds comprising a combination of a metal of the non-noble metallic bonding landing pad, a main solder metal, and a metal selected from the group consisting of Ni and Co.

8. The substrate of claim 3, wherein the main solder metal is selected from the group consisting of Sn, Zn, Bi, Pb, and In.

9. A method for manufacturing a substrate, comprising:
providing a substrate comprising, on a main surface, at least one non-noble metallic bonding landing pad;
cleaning the main surface of the substrate;
depositing a capping layer on the cleaned surface of the metallic bonding landing pad, whereby the non-noble metallic bonding landing pad is at least partially covered by the capping layer, wherein the at least one non-noble metallic bonding landing pad is in direct contact with the capping layer, wherein a thickness of the capping layer is greater than 9 nm and smaller than 50 nm, wherein the capping layer is an alloy selected from the group consisting of NiB and CoB, wherein the alloy has an atomic concentration percentage of boron of from 10% to 50%; and
providing, as a result of soldering, a material layer that at least partially covers the part of the non-noble metallic bonding landing pad not covered by the capping layer, the material layer comprising intermetallic compounds and interstitial boron, the intermetallic compounds comprising a combination of a metal of the non-noble metallic bonding landing pad, a main solder metal, and a metal selected from the group consisting of Ni and Co, whereby the substrate of claim 3 is obtained.

10. The substrate of claim 3, wherein the non-noble metallic bonding landing pad at least partially extends above the main surface and the capping layer covers a topside of the non-noble metallic bonding landing pad.

11. The substrate of claim 3, wherein the non-noble metallic bonding landing pad at least partially extends above the main surface and the capping layer covers sidewalls of the non-noble metallic bonding landing pad that extend above the main surface.

12. The substrate of claim 3, wherein the non-noble metallic bonding landing pad is bonded to a further material and said bonding landing pad at least partially extends above the main surface and the capping layer covers a topside of the non-noble metallic bonding landing pad.

13. The substrate of claim 3, wherein the non-noble metallic bonding landing pad is bonded to a further material and said bonding landing pad at least partially extends above the main surface and the capping layer covers sidewalls of the non-noble metallic bonding landing pad that extend above the main surface.

14. The substrate of claim 3, wherein the alloy has an atomic concentration percentage of boron of from 20% to 50%.

15. A substrate, comprising:
at least one main surface comprising at least one non-noble metallic bonding landing pad at least partially covered by a capping layer, wherein the non-noble metallic bonding landing pad contains at least one metal selected from the group consisting of Cu, Co, Ni, Mo, Mn, and combinations thereof, wherein the at least one non-noble metallic bonding landing pad is fully covered by the capping layer, wherein the at least one non-noble metallic bonding landing pad is in direct contact with the capping layer, wherein a thickness of the capping layer is greater than 9 nm and smaller than 50 nm, wherein the capping layer is configured to shield the at least one non-noble metallic bonding landing pad from an external environment, wherein the capping layer consists of an alloy selected from the group consisting of $Ni_1B_1$ and $Co_1B_1$.

* * * * *